United States Patent
Butler et al.

(10) Patent No.: US 10,431,551 B2
(45) Date of Patent: *Oct. 1, 2019

(54) VISUAL IDENTIFICATION OF SEMICONDUCTOR DIES

(71) Applicant: Texas Instruments Incorporated, Dallas, TX (US)

(72) Inventors: Kenneth Michael Butler, Richardson, TX (US); Kalyan Chakravarthy Cherukuri, Allen, TX (US); Stephanie Watts Butler, Richardson, TX (US); Venkataramanan Kalyanaraman, Dallas, TX (US); Hubert Joseph Payne, Parker, TX (US); Yazdi Dinshaw Contractor, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/868,738

(22) Filed: Jan. 11, 2018

(65) Prior Publication Data

US 2018/0130754 A1   May 10, 2018

Related U.S. Application Data

(63) Continuation of application No. 15/046,639, filed on Feb. 18, 2016, now Pat. No. 9,899,332.

(51) Int. Cl.
*H01L 23/544*  (2006.01)

(52) U.S. Cl.
CPC .. *H01L 23/544* (2013.01); *H01L 2223/54406* (2013.01); *H01L 2223/54413* (2013.01); *H01L 2223/54433* (2013.01); *H01L 2223/54473* (2013.01); *H01L 2223/54486* (2013.01)

(58) Field of Classification Search
CPC . H01L 2223/54406; H01L 2223/54413; H01L 2223/54433; H01L 2223/54473; H01L 2223/54486; H01L 23/544
See application file for complete search history.

(56) References Cited

U.S. PATENT DOCUMENTS

| | | | |
|---|---|---|---|
| 6,750,479 B2 * | 6/2004 | Haag | H01L 21/50 250/239 |
| 8,415,813 B2 * | 4/2013 | Wang | H01L 23/544 257/797 |
| 9,076,799 B2 * | 7/2015 | Brenna | H01L 23/544 |

(Continued)

FOREIGN PATENT DOCUMENTS

JP         06037156 A      2/1994

*Primary Examiner* — Mohammed Shamsuzzaman
(74) *Attorney, Agent, or Firm* — Dawn Jos; Charles A. Brill; Frank D. Cimino

(57) ABSTRACT

Systems and methods for visual identification of semiconductor dies are described. In some embodiments, a method may include: receiving a semiconductor wafer having a plurality of dies and printing a unique visual identification mark on each of the plurality of dies. In other embodiments, a method may include receiving an electronic device comprising a die and a package surrounding at least a portion of the die and reading, from the electronic device, a unique visual identification mark that encodes a Cartesian coordinate of the die relative to a reference point on a semiconductor wafer.

20 Claims, 4 Drawing Sheets

(56) References Cited

U.S. PATENT DOCUMENTS

| | | | |
|---|---|---|---|
| 2009/0098487 A1* | 4/2009 | Jacobson | G03F 7/70425 |
| | | | 430/312 |
| 2012/0319307 A1 | 12/2012 | Wang et al. | |
| 2013/0069214 A1* | 3/2013 | Morioka | H01L 23/49503 |
| | | | 257/676 |
| 2014/0061952 A1* | 3/2014 | Rampley | H01L 23/544 |
| | | | 257/782 |
| 2014/0167272 A1* | 6/2014 | Martens | H01L 23/3171 |
| | | | 257/773 |
| 2016/0064334 A1* | 3/2016 | Bishop | H01L 23/544 |
| | | | 438/15 |
| 2016/0172306 A1* | 6/2016 | Scanlan | H01L 21/561 |
| | | | 438/462 |

\* cited by examiner

VISUAL IDENTIFICATION OF SEMICONDUCTOR DIES

CROSS REFERENCE TO RELATED APPLICATIONS

This application is a continuation of U.S. application Ser. No. 15/046,639, filed Feb. 18, 2016, the contents of which is herein incorporated by reference in its entirety.

TECHNICAL FIELD

This specification is directed, in general, to electronic circuits, and, more specifically, to systems and methods for visual identification of semiconductor dies.

BACKGROUND

In chip manufacturing, multiple dies are fabricated on a single semiconductor wafer. These dies are then separated and packaged into individual chips, each having a number of integrated circuits (ICs). In order to keep track of each die during the manufacture process and beyond, each die may be assigned a unique identifier (die-ID) while on its wafer, and each wafer may be assigned to a lot. Certain additional data corresponding to the dies (e.g., product, grade, etc.) may be combined with their respective die-IDs provide additional die information.

Tracing information is useful for tracking each individual die's history of operation(s), carrier used for its transportation, the lot it belonged to at various times, etc. For example, if a die later proves unreliable, it is beneficial to identify the source of the die and to determine how and when the die unit was manufactured, in order to aid the semiconductor manufacturer in improving its manufacturing processes.

The inventors have recognized that the spatial position (e.g., X and Y) of a die in a wafer is a crucial piece of information in process traceability for root cause analysis of characterization issues, production yield loss, qualification failures, and customer returns. A known technique for obtaining and storing location information is to write that information during a wafer probe test operation, for example, into a non-volatile memory (NVM) element of the die itself. This information can be electrically accessed after device is packaged, and it is commonly referred as "electrical die-ID."

As the inventors have also recognized, however, the aforementioned technique presents a number of drawbacks. First, silicon area needs to be allocated in the die for identification, in cases when traceability is needed after manufacturing. Added die area increases cost of goods sold (COGS) for the product. Design and test engineering investment is needed to implement the technique in each device, which increases the cost of new product development. Second, probe testing is required. Third, because information is stored electrically, it is only possible to extract it when communication with the device's NVM is successful. Failure mechanisms such as die-crack, physical damage, wire bond failures, broken leads, electrical overstress, defects in power supply or reference blocks that prevent power-up of a device, etc. can make it impossible to read traceability information from the NVM. Fourth, non-volatile or other storage mechanisms require extra mask layers, which increases the wafer manufacturing cost. Due to these, and other limitations, electrical die-ID methods are only used in a few types of devices.

SUMMARY

Systems and methods for visual identification of semiconductor dies are described. In an illustrative, non-limiting embodiment, a method may include receiving a semiconductor wafer having a plurality of dies and printing a unique visual identification mark on each of the plurality of dies.

In some cases, the unique visual identification mark for a given die may encode a Cartesian coordinate of the given die relative to a reference point on the semiconductor wafer. Additionally or alternatively, the unique visual identification mark for a given die may encode a wafer identification of the semiconductor wafer. Additionally or alternatively, the unique visual identification mark for a given die may encode a lot identification of the semiconductor wafer. Additionally or alternatively, the unique visual identification mark for a given die may include encrypted information.

Moreover, printing the unique visual identification mark on a given die may include laser scribing or tip scrubbing a plurality of bond pads or terminals of the given die. Each character in the unique visual identification mark may follow a decimal alphabet where one or more corners of each bond pad or terminal are marked, scratched, or cut in a manner corresponding to a respective numeral.

Additionally or alternatively, printing the unique visual identification mark may include laser scribing, etching, or inking a designated area of a surface of a package encapsulating the given die. The designated area may include a plurality of instances of a geometric shape disposed as an array, where each instance of the geometric shape includes one or more corners that are marked, scratched, or cut in a manner corresponding to a number or character.

In another illustrative, non-limiting embodiment, an electronic device may include a die and a package surrounding at least a portion of the die, where the electronic device includes a unique visual identification mark that encodes a Cartesian coordinate of the die relative to a reference point on a semiconductor wafer.

In some cases, the unique visual identification mark may further encode a wafer identification of the semiconductor wafer. Additionally or alternatively, the unique visual identification mark may further encode a lot identification of the semiconductor wafer. The unique visual identification mark may include laser scribed or tip scrubbed bond pads or terminals, and each character in the unique visual identification mark may follow a decimal alphabet where one or more corners of each bond pad or terminal are marked, scratched, or cut in a manner corresponding to a respective numeral.

Additionally or alternatively, the unique visual identification mark may include a laser scribed, etched, or inked area of a surface of the package. The may include a plurality of instances of a geometric shape disposed as an array, and each instance of the geometric shape may include one or more corners that are marked, scratched, or cut in a manner corresponding to a number or character.

In yet another illustrative, non-limiting embodiment, a method may include receiving an electronic device comprising a die and a package surrounding at least a portion of the die and reading, from the electronic device, a unique visual identification mark that encodes a Cartesian coordinate of the die relative to a reference point on a semiconductor wafer.

The unique visual identification mark may include laser scribed or tip scrubbed bond pads or terminals, and the method may include at least one of: removing at least a portion of the package prior to the reading operation; or reading the unique visual identification mark using an X-ray device. Each character in the unique visual identification mark may follow a decimal alphabet where one or more corners of each bond pad or terminal are marked, scratched, or cut in a manner corresponding to a respective numeral. The unique visual identification mark may include a laser scribed, etched, or inked area of a surface of the package, where the area includes a plurality of instances of a geometric shape disposed as an array, and where each instance of the geometric shape includes one or more corners that are marked, scratched, or cut in a manner corresponding to a number or character.

BRIEF DESCRIPTION OF THE DRAWINGS

Reference will now be made to the accompanying drawings, wherein.

DETAILED DESCRIPTION

Figure 1:
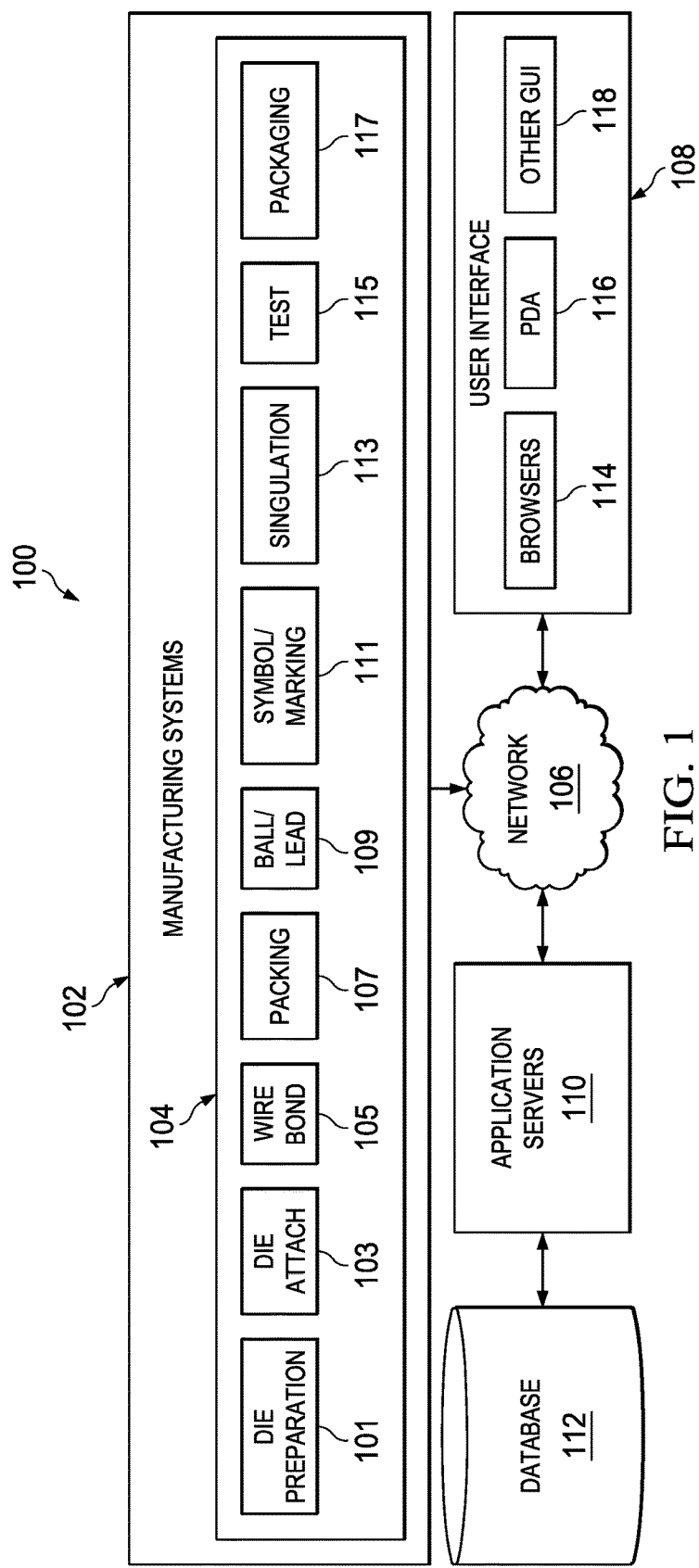
FIG. 1 is a diagram of an example of a semiconductor production system, according to some embodiments.

Embodiments now will be described more fully hereinafter with reference to the accompanying drawings. The systems and methods described herein may, however, be embodied in many different forms and should not be construed as limited to the implementations set forth herein. Rather, these embodiments are provided so that this disclosure will be thorough and complete. A person of ordinary skill in the art will be able to make and use the various embodiments described herein.

Systems and methods described herein may provide a set of operations which may be used together or in subsets in order to achieve unique die symbolization. As used herein, the term "die-ID" refers to an individual die's original X-Y coordinates or position on a semiconductor wafer, in addition to any combination of the following: a wafer identification (wafer-ID), a lot identification (lot-ID), and/or a leadframe identification (leadframe-ID).

Information regarding die's position within a reticle may be inscribed onto the die during wafer manufacturing. For example, such information may be included in a reticle or photomask when the reticle or photomask is created.

In some cases, a full-wafer embossing process may be used to either describe or encode the reticle position on the wafer, or the individual X and Y coordinates of each die, along with the wafer identification number and/or lot number, if so desired. For example, embossing may be achieved by using a 1× full wafer reticle for process steps such as protective overcoat (PO), polyimide (PI), ALCAP (AL), or bump processing.

Additionally or alternatively, the same information may be inscribed on each die using a laser processing technique. Additionally or alternatively, the information may be physically "stamped" onto each die location with a process similar to probing, except that the probe tip may encode coordinate information. The stamping may occur on PO or PI or within one or more pads or other designated locations on each die. Additionally or alternatively, a dummy fill is another option to add "within reticle shot" location information.

There are multiple techniques in which die-ID information may be recorded, including, but not limited to, conventional alphabetic characters in any language, binary or hex encoding, Braille, bar coding, or Morse code. Trade-offs involved in choosing a particular solution include the size of the area required versus the ease of printing and later reading and decoding the information, plus the possible need to hide or otherwise encrypt the information so that others may not easily read it.

Although not required, a standardized location may be designated on every die, regardless of size, in which the die-ID may be written, which makes it simpler for downstream equipment to locate that information with little or no human intervention.

During production, the wafer identification and X-Y coordinates embossed onto each die may be read and then inscribed via either laser, X-ray-visible inking, or infrared-visible marks onto various additional locations. One such location includes unused space between the scribe seals and the edges of the die. Another such location is onto the leadframe, either in the "dap" or "paddle" area around the die, or onto the tab locations. Either of these operations may be performed in such a way as to be visible via X-ray through the completed package.

Optionally, the wafer identification and X-Y coordinates for the die may be carried forward and printed or laser etched or otherwise inscribed on the outer surface of the package, if so desired. Additionally or alternatively, the wafer identification and X-Y coordinates for the die may be carried printed or laser etched or otherwise inscribed on the back side of the die.

Systems and methods described herein are in contrast with conventional solutions that require some form of electrical testing in order to either write or read the die-ID, or both. The techniques described herein have no electrical test requirements at all, but can still provide unique identification and resolution down to the wafer-ID/X/Y level.

As such, these techniques are particularly useful in situations where no probe solution exists, which is fairly common in the production of analog devices. Depending upon the embodiment implemented, these techniques require either zero or near-zero die area increase to implement. Also, potentially no mask or design changes are required. The resulting die-ID information may be used to recover die manufacturing history information (e.g., for qualification or customer returns) because it enables reading of the die-ID via a de-capsulation of the package, if so desired.

To illustrate the foregoing, FIG. 1 is a block diagram of an example of a semiconductor production system. System 100 can include one or more manufacturing systems 102; testing, assembly, and packaging system 104; host network 106; user interface 108; application server 110; and database 112. Testing, assembly, and packaging system 104 may include devices for performing numerous semiconductor fabrication operations including, for example, die preparation 101, die attach 103, wirebonding 105, molding 107, ball lead 109, symbol/marking 111, singulation 113, testing 115, and packaging 117.

Generally speaking, die preparation operation 101 receives a wafer and performs one or more chemical or physical processing steps, including, for example, sawing each individual die away from the wafer. In some cases, the wafer may include a wafer-ID that is visually or optically printed thereon. During die attach operation 103, individual dies are attached to leadframes. Each leadframe may also include a leadframe-ID printed thereon.

Wire bonding 105 is a method of making interconnections with a die or between different dies. Molding 107 is an electronic packaging process where a die is encapsulated with Epoxy Molding Compound (EMC) to prevent physical damage or corrosion, for example, such that the encapsulant material becomes the device's package. Ball/lead operation 109 adds solder balls or leads to the terminals of a resulting electronic device's package. Symbolization operation 111 prints or engraves logos, names, symbols or other information on the surface of the device's electronic package. Singulation operation 113 divides the resulting devices into discrete elements. Test operation 115 includes electrical and functional testing of the device. And packing operation 117 refers to the packing (not to be confused with the electronic packaging of operation 107) of the resulting devices in boxes prior to shipping to customers.

As a person of ordinary skill in the art will recognize in light of this disclosure, any number of different semiconductor manufacturing processes and operations may be contemplated for use with system 100.

In various embodiments, application server 110 generates unique die-IDs for each die. Application server 110 assigns the die-IDs in one-to-one correspondence to the dies. Additionally or alternatively, die-IDs may be generated by manufacturing system 102. These die-IDs may be stored in database 112.

As to the tracing of individual dies and their histories as they proceed through production system 102, embodiments described herein associate, for each die-IDs corresponding to each given die: a wafer ID, a leadframe ID, a location of the given die on the wafer (wafer location) prior to die attach operation 103, and a location of the given die on the leadframe (leadframe location) after die attach operation 103.

Figure 2:
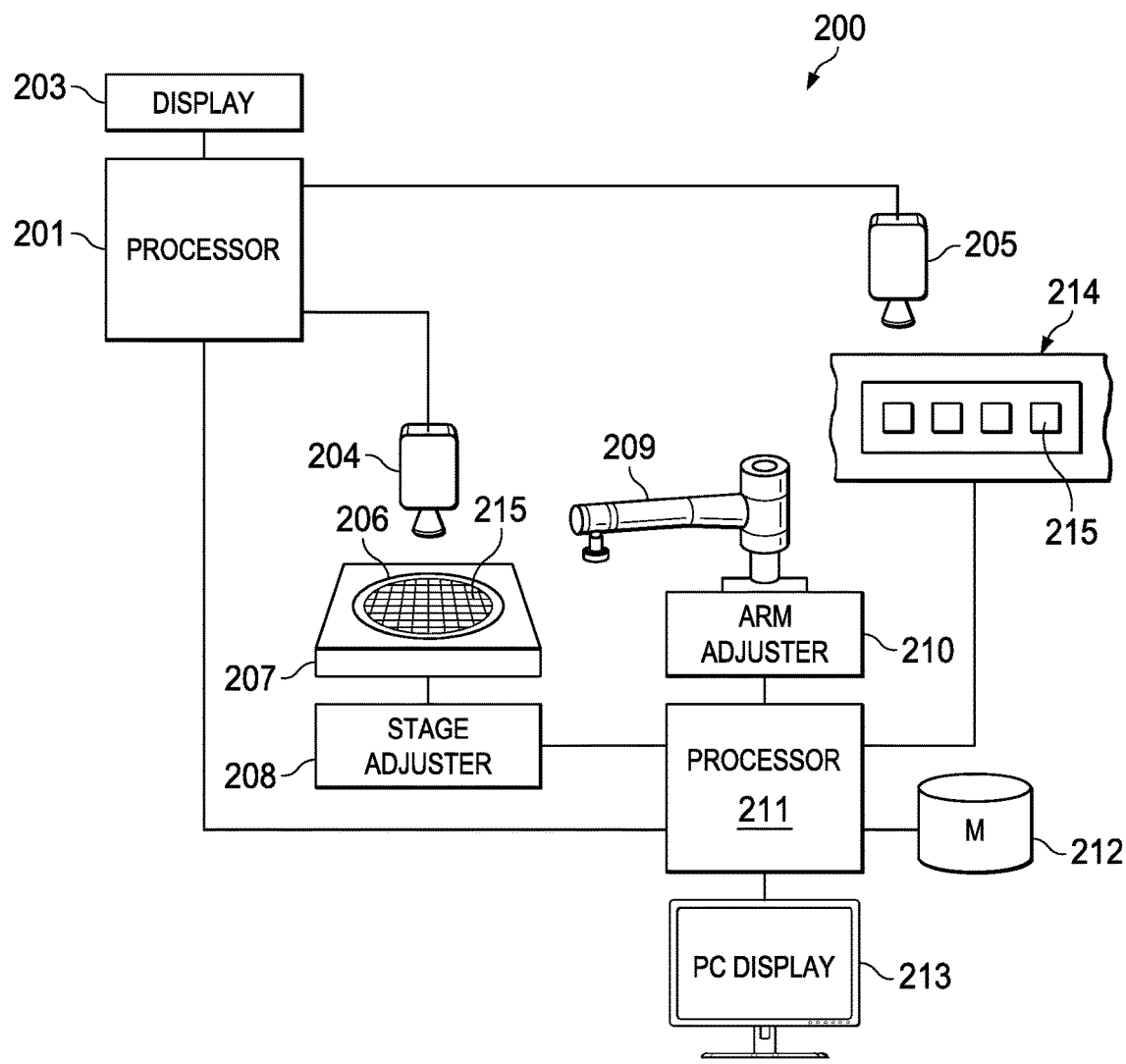
FIG. 2 is a diagram of an example of manufacturing tools usable in a semiconductor production system, according to some embodiments.

For example, wafer location information may be obtained, for each die, from a suitable device used during die preparation operation 101. Moreover, a die bonder tool used during die attach operation 103 may provide leadframe location information for each die. Wafer-ID and leadframe-ID may be obtained from any camera or optical sensor used in testing, assembly and packaging system 104, as shown in FIG. 2. These various pieces of information may be stored in database 112 and correlated to one another via the die-ID, which may then be visually marked on the electronic device.

Manufacturing system 102 may transmit data related to the transfer operation of die units performed by each device in testing, assembly and packaging system 104 to application server 110. Application server 110 receives this data via the network 106 and stores the resulting information (e.g., string(s)) in database 112. In this fashion, system 100 traces a particular die's history as it is passed from one point to another. User interface 108 enables a user operating browsers 114, tablets/cellphones/personal digital assistants 116, or other graphical user interface devices 118 to interact with application sever 110, for example, to retrieve information from database 112.

Referring to FIG. 2, a block diagram of an example of manufacturing tools 200 usable in a semiconductor production system 100 is described. In various embodiments, tools 200 may be used to perform one or more operations involved, for example, in die preparation process 101 and/or die attach process 103. As shown, silicon wafer 206 is carried by table 207 which is moveable in conjunction with a table or stage adjuster 208. Robot 209 includes a controllable arm adjuster 210 that allows it to create or manipulate individual dies 215 on wafer 206, and to places those dies 215 on leadframe 214.

Wafer table 207 via adjuster 208 moves wafer 206 to locate the next die under program control of processor 211 so that robot arm 209 picks up die 215 from wafer 206 and places it on leadframe 214. After table 207 is moved to a known good die, an output signal is produced by processor 211 and, the output signal may be delivered to the adjuster 208 so as to reposition wafer table 207. In some cases, the location of the die on the wafer is recorded. These operations may be displayed by processor 201 on display 203 or by processor 211 on display 213.

Arm adjuster 210 and stage adjuster 208 are controlled by processor 211. A leadframe handling system may move and position leadframe 214 to allow proper placement of the dies 215. For example, such a leadframe handling system may apply epoxy to pads of leadframe 104 before dies 215 are placed on leadframe 214. In some cases, the location of the die on leadframe 214 is also recorded.

In order to perform a visual reading of markings imprinted upon wafer 206, die 215, and/or leadframe 214, processor 211 receives video or still images from video cameras 204 and 205 (such as a CCD camera), respectively. In some implementations, cameras 204 and 205 may include optic components that enable it focus on those visual or optical markings.

In sum, processor 211 may therefore receive information regarding a wafer ID, leadframe ID, wafer location, and leadframe location for each individual die during various semiconductor manufacturing operations. These, and other useful pieces of information, may be stored in memory or database 112.

Figure 3:
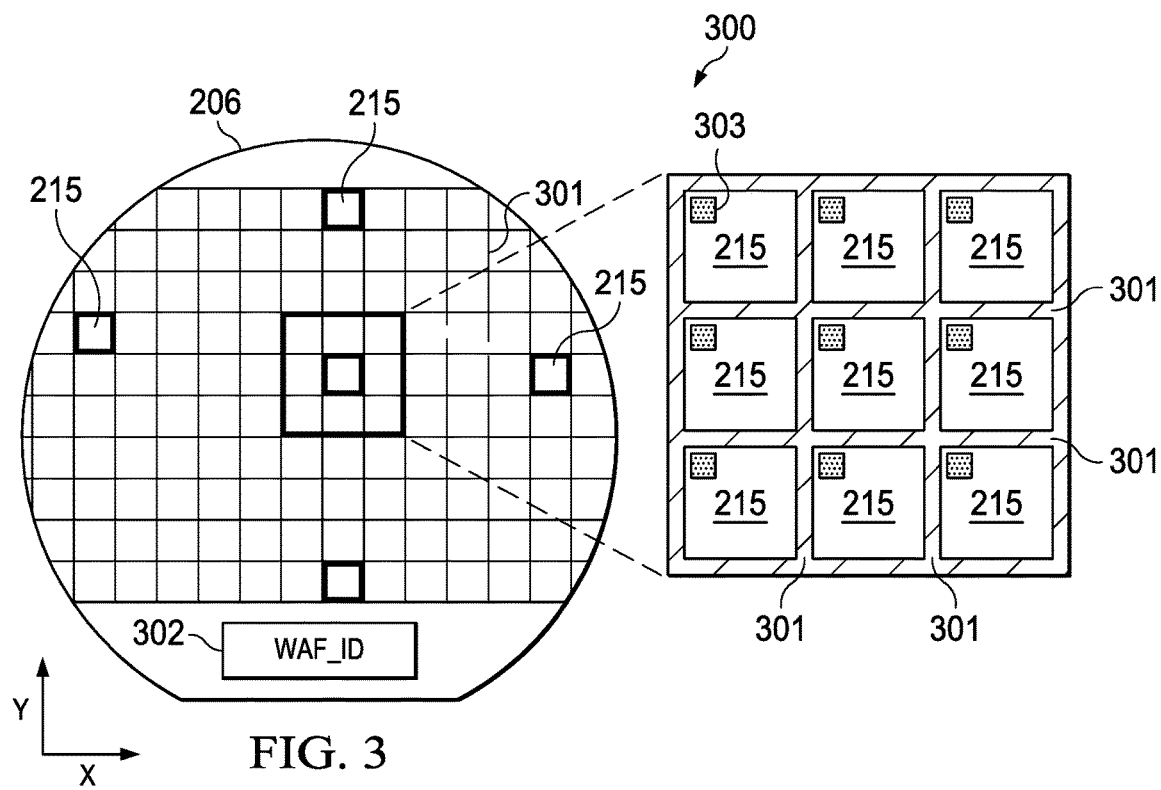
FIG. 3 is a diagram of an example of a wafer having unique visual identification marks in each die, according to some embodiments.

FIG. 3 is a diagram of an example of wafer 206 having unique visual identification marks in each of its die, according to some embodiments. In various embodiments, wafer 206, when loaded onto a die-attach tool, already includes a wafer-ID that is scribed onto the bottom of the wafer (or some other unique identifier). Particularly, wafer 206 includes a plurality of dies 215 spaced by horizontal and vertical gaps 301, also referred to as "scribe streets." The unique identifier for wafer 206 is recorded as WAF_ID 302; which may also enable the die-attach tool to pull a wafer map for wafer 206 as part of a pick operation.

In various embodiments, unique visual identification marks 303 may be imprinted upon each respective die 215 with multiple techniques including, but not limited to, laser scribing, tip scrubbing, etching, or physical inking. Unique visual identification marks 303 may represent, for each die 215, a die-ID that includes any of the following information: Lot ID, wafer ID, X coordinate of the die, and Y coordinate of the die (e.g., relative to a reference point on the wafer). Moreover, any optical fingerprinting method, such as, but not limited to, image of a die or scan of topographical profile may also be used in isolation or in conjunction with above the method to build a unique optical signature for each die.

Each unique visual identification mark 303 may be read, for example, with camera system 205.

As such, each visual identification mark 303 may serve as a unique identifier its respective die 215, allowing full traceability back through wafer manufacturing. In some cases, the die-ID may be obtained by (a) creating any combination of wafer identification, leadframe identification, wafer location, and leadframe location, or any portion thereof, and (b) encoding the resulting information or string with a secure encryption key or hash algorithm. In some cases, the assembly lot number may also be used in this process along with other traceability data.

In some cases, each of dies 215, still while part of wafer 206, may have its Cartesian coordinates and/or wafer-ID 302 printed thereon as visual identification mark 303 prior to being sawed in die preparation operation 101. Additionally or alternatively, data may be added to visual identification mark 303 in subsequent operations. For example, part of symbol or marking operation 111 may include adding a leadframe-ID to visual identification mark 303.

Figure 4:
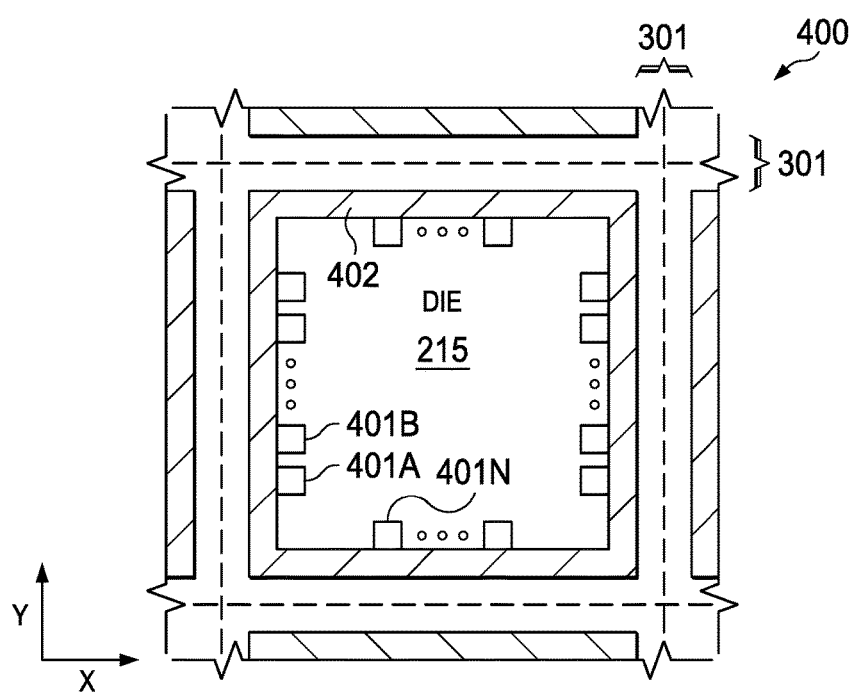
FIG. 4 is a diagram of an example of a die having unique visual identification marks, according to some embodiments.

FIG. 4 is a diagram of an example of die 215 having unique visual identification marks, according to some embodiments. As shown, die 215 is separated from other dies on wafer 206 by scribe streets 301. Each scribe street 301 may include a scribe area sandwiched between two scribe seals. In some embodiments, surrounding area 402 between a nearest scribe seal of scribe street 301 and die 215 may be used to print a visual identification mark 303 or portion thereof.

Die 215 also includes a plurality of bond pads or electrical terminal 401A-N. In this example, bond pad or terminal 401A is chosen as the index pad—that is, the first pad (0, 0) to which the locations of all other pads 401B-N are referenced. Although pads 401A-N in this example have a square shape, in other embodiments they may have any other suitable shapes (e.g., octogonal).

In various embodiments, visual identification mark 303 or a portion thereof may be encoded on one or more of pads 401A-N. For example, index pad 401A may have a first character or numeral printed thereon, and subsequent characters or numerals may be imprinted in each subsequent pad in a clockwise (or counterclockwise) direction. In some implementations, these characters or numerals may be imprinted using a laser scribing or tip scratching process (e.g., using a probe with a modified tip).

Figure 5:
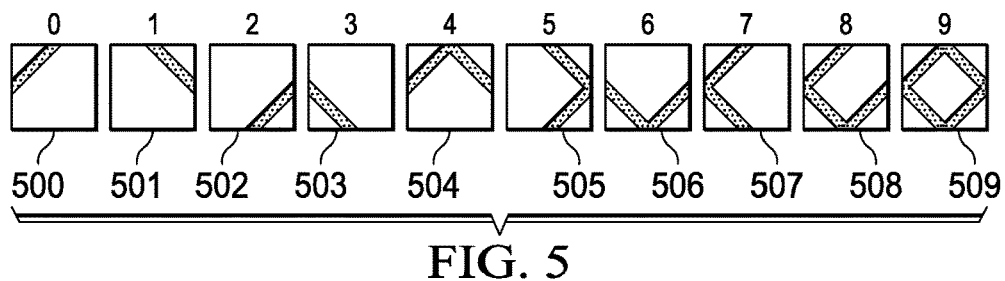
FIG. 5 is a diagram of an example of a decimal alphabet usable with bond pads or other surfaces within a die, according to some embodiments.

FIG. 5 is a diagram of an example of a decimal alphabet usable with bond pads or electrical terminals within a die, according to some embodiments. As illustrated, each numeral 0-9 may be represented in pads 500-509 by removing material from the bond pad. Particularly, one or more corners of each bond pad or terminal are marked, scratched, or cut in a manner corresponding to a respective numeral. In various embodiments, markings sufficient to provide a visual indication of each character conveyed may be made without significantly changing the electrical or conductive properties of the underlying pad. Similarly as above, although pads 500-509 in this example have a square shape, in other embodiments they may have other suitable geometric shape.

In some embodiments, information stored in the form visual identification mark 303 on die 215 itself may then be read during processing by semiconductor production system 100, optionally modified (e.g., encrypted or with other information added), and added to other locations. For example, visual identification mark 303 may be read from bond pads 401A-N or surrounding area 402 (e.g., using a camera) and added to a leadframe during die attach operation 103 and/or to a device package during symbol/marking operation 111.

Figure 6:
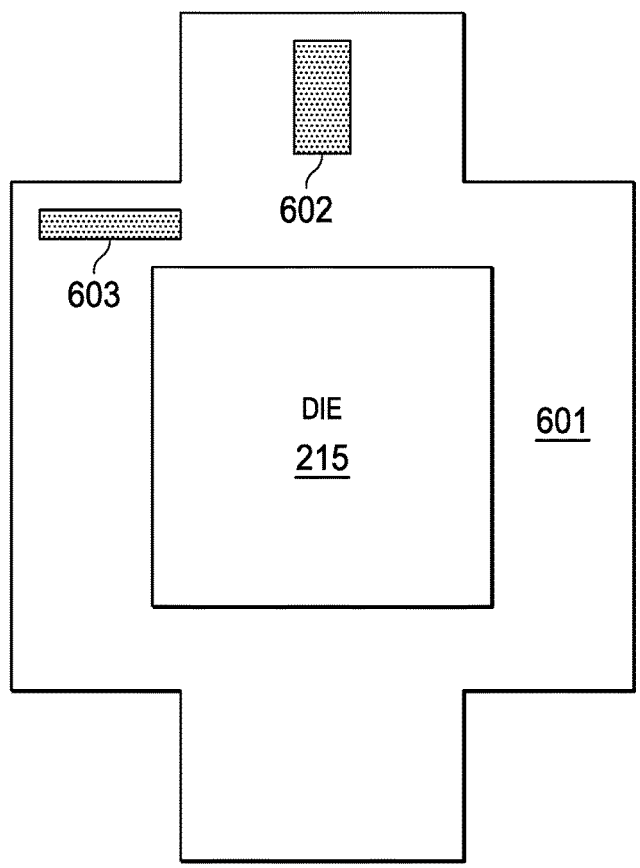
FIG. 6 is a diagram of an example of a leadframe having unique visual identification marks for a die, according to some embodiments.

An implementation of the foregoing techniques is shown in FIG. 6, where die 215 is attached to leadframe 601. As shown, leadframe 601 includes "dap" or "paddle" areas around die 215, thus providing an additional opportunity to print visual identification mark 303 upon locations 602 and/or 603, for example.

Figure 7:
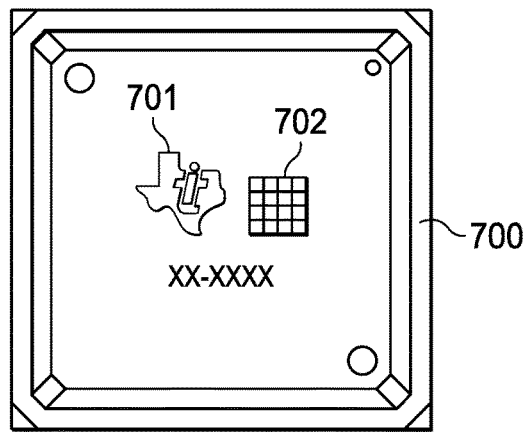
FIG. 7 is a block diagram of an example of an electronic device packaging having unique visual identification marks for a die, according to some embodiments.

Yet another implementation of the foregoing techniques is illustrated in FIG. 7, where an example electronic device package 700 includes a manufacturer's logo, part names, etc. 701 imprinted thereon, along with a standardized, dedicated, and/or designated area 702 for visual identification mark 303. In some cases, area 702 may include a plurality of instances of a geometric shape disposed as an array, and each instance of the geometric shape may include one or more corners that are marked, scratched, or cut in a manner similar to that shown in FIG. 5. For example, the bottom (or top) row or column of the array may represent a lot number, a subsequent row or column may represent a wafer number, a still subsequent row or column may represent an X coordinate of the die, and a yet subsequent row or column may represent a Y coordinate of the die.

After the finalized device is deployed in the field or shipped to a customer, the visual identification mark 303 marked on a given chip or device package, leadframe, or die may be read by automated test equipment in order to perform any number of traceability operations.

The systems and methods described herein provide new procedures for printing traceability information on an electronic device; procedures which may be enabled in existing assembly processes. In many implementations, information is not electronically stored in the die itself, thus resulting in a significantly cheaper solution (compared to electrical die-IDs). No die design changes are needed, and these techniques may be applied to existing devices in production. Moreover, because traceability information may be visually or optically printed on a device, electrical failure of the die does not impede traceability.

Most analog products do not contain a die-ID block due to size, pin count, and/or cost limitations. Furthermore, many analog products do not have a probe test insertion, which is the manufacturing step where electrical die-ID details are incorporated into a die. The systems and methods described herein enable die-IDs to be utilized in low cost, small die size, low pin count products even if they do not have a probe test insertion.

In various embodiments, the systems and methods described herein enable die-ID and location information to be visually obtained. Probe testing is not necessary for this method, lowering COGS. Data may be marked on an encapsulating package using commonly available laser scribe infrastructure. There is no added die area; die size reduction can also lead to smaller packages which is a competitive advantage. No non-volatile memory element is needed in the die. Due to the lack of requirement for NVM, these techniques are applicable to more semiconductor process technologies than techniques which require NVM. Moreover, traceability of dies within the assembly process is provided without electrical access to the units (traceability is also enabled for analog dies and other components that do not have digital memories by design). These methods are scalable across all wafer fabrication processes.

The techniques described herein provide a factory-level solution. No significant product level design, test engineering time, or investment is needed. A one-time infrastructure investment enables all current production and future products to leverage this approach.

As a person of ordinary skill in the art will recognize in light of this disclosure, the systems and methods described herein enable a number of new applications. For example, package marking may be photographed and emailed to begin customer return processing.

Customers that require preliminary investigation reports based on lot trace code information benefit from being able to extract internal test data and processing history of failing units from a manufacturer's system. (With electrical die-ID, this process takes multiple days as customer has to physically return the failing unit to the manufacture and unit must then be tested to extract the die-ID.) If communication of device is impacted by a failure, then it may not be possible to extract die-ID.

Package markings may be read by post test tools such as tape and reel to enable post final test sorting of units based on wafer/unit statistics.

Wafer-level statistical screening methods may be performed offline after final test operation to identify outliers/triggers. By reading package marking, post-final test tools such as, but not limited to, tape and reel machine, may bin out outliers. Performing wafer-level outlier detection for non-probe devices is a unique competitive advantage.

High performance and sensor conditioning circuits require guarantee of temperature drift by testing. Currently, this is either performed by specialized systems that can alter temperature during testing (impact is low throughput) or by addition of a memory into the device to store temperature data. With the techniques described herein, however, unit-level test information may be retrieved across two test insertions at different temperatures and bin units based on temperature drift at tape and reel operation.

Many customers request serialized qualification—that is, unit level traceability and data analysis of pre- and post-qualification stress test data—to identify drifts. Currently for devices without electrical die-IDs, this is done by manually marking parts and tracking them by hand test. This is a very low throughput and high cost operation. With the systems and methods described herein, as each manufactured unit is marked already and the test system has ability to read this marking automatically, unit-level analysis of qualification becomes easy.

Furthermore, because each device for a material is uniquely marked with encoded data and key for each device, counterfeit detection is possible at a unit level.

It should be understood that the various operations described herein may be implemented by processing circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

A person of ordinary skill in the art will appreciate that the various circuits depicted above are merely illustrative and is not intended to limit the scope of the disclosure described herein. In addition, the operations performed by the illustrated components may, in some embodiments, be performed by fewer components or distributed across additional components. Similarly, in other embodiments, the operations of some of the illustrated components may not be provided and/or other additional operations may be available. Accordingly, systems and methods described herein may be implemented or executed with other circuit configurations.

It will be understood that various operations discussed herein may be executed simultaneously and/or sequentially. It will be further understood that each operation may be performed in any order and may be performed once or repetitiously.

Many modifications and other embodiments will come to mind to a person of ordinary skill in the art to which such embodiments pertain having the benefit of the teachings presented in the foregoing descriptions, and the associated drawings. Therefore, it is to be understood that the embodiments are not to be limited to the specific implementations disclosed. Although specific terms are employed herein, they are used in a generic and descriptive sense only and not for purposes of limitation.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic device, comprising:
 a die; and
 a package surrounding the die, wherein the electronic device includes a unique visual identification mark, wherein a first character of a set of characters in the unique visual identification mark includes at least one line that connects two adjacent sides of a bond pad of the die, wherein the unique visual identification mark encodes a Cartesian coordinate of the die relative to a reference point on a semiconductor wafer.

2. The electronic device of claim 1, wherein the unique visual identification mark further encodes a wafer identification of the semiconductor wafer.

3. The electronic device of claim 1, wherein the unique visual identification mark further encodes a lot identification of the semiconductor wafer.

4. The electronic device of claim 1, wherein the unique visual identification mark includes laser scribed or tip scrubbed bond pad or terminal.

5. The electronic device of claim 4, wherein one or more corners of the bond pad or terminal are marked, scratched, or cut in a manner corresponding to a respective numeral.

6. The electronic device of claim 1, wherein a second character of the set of characters includes at least two lines that together connect three adjacent sides of the bond pad of the die.

7. The electronic device of claim 1, wherein a third character of the set of characters includes at least three lines that together connect four adjacent sides of the bond pad of the die.

8. The electronic device of claim 1, wherein a fourth character of the set of characters includes at least four lines that together connect four adjacent sides of the bond pad of the die.

9. An electronic device, comprising:
a die; and
a package associated with the die, wherein the electronic device includes a unique visual identification mark to identify a die location on a semiconductor wafer, wherein a first character of a set of characters in the unique visual identification mark includes at least one line that connects two adjacent sides of a bond pad of the die.

10. The electronic device of claim 9, wherein a second character of the set of characters includes at least two lines that together connect three adjacent sides of the bond pad of the die.

11. The electronic device of claim 9, wherein a third character of the set of characters includes at least three lines that together connect four adjacent sides of the bond pad of the die.

12. The electronic device of claim 9, wherein a fourth character of the set of characters includes at least four lines that together connect four adjacent sides of the bond pad of the die.

13. The electronic device of claim 9, wherein the unique visual identification mark encodes a Cartesian coordinate of the die relative to a reference point on the semiconductor wafer.

14. The electronic device of claim 9, wherein the unique visual identification mark further encodes a wafer identification of the semiconductor wafer.

15. The electronic device of claim 9, wherein the unique visual identification mark further encodes a lot identification of the semiconductor wafer.

16. The electronic device of claim 9, wherein the package is of an epoxy molding compound.

17. An electronic device, comprising:
a die; and
a package associated with the die, wherein the electronic device includes a unique visual identification mark to identify a die location on a semiconductor wafer, wherein a first character of a set of characters in the unique visual identification mark includes at least one mark that connects two adjacent sides of a bond pad of the die.

18. The electronic device of claim 17, wherein a second character of the set of characters includes at least two marks that together connect three adjacent sides of the bond pad of the die.

19. The electronic device of claim 17, wherein a third character of the set of characters includes at least three marks that together connect four adjacent sides of the bond pad of the die.

20. The electronic device of claim 17, wherein a fourth character of the set of characters includes at least four marks that together connect four adjacent sides of the bond pad of the die.

* * * * *